United States Patent
Maguire et al.

[19]

[11] Patent Number: 6,038,525
[45] Date of Patent: Mar. 14, 2000

[54] PROCESS CONTROL FOR PULSED LASER DEPOSITION USING RAMAN SPECTROSCOPY

[75] Inventors: John Francis Maguire, Helotes, Tex.; John David Busbee, Beavercreek, Ohio; David Charles Liptak, Dayton, Ohio; David Peter Lubbers, Cincinnati, Ohio; Steven R. LeClair, Spring Valley, Ohio; Rand Robert Biggers, Dundee, Ill.

[73] Assignee: Southwest Research Institute, San Antonio, Tex.

[21] Appl. No.: 08/846,437

[22] Filed: Apr. 30, 1997

[51] Int. Cl.[7] .................................................. G01B 11/06
[52] U.S. Cl. ........................ 702/172; 702/170; 356/301; 356/381
[58] Field of Search ................... 364/528.01, 528.09, 364/528.38, 149–151, 468.15–468.17, 468.19–468.21, 468.24–468.28, 474.08, 578; 702/22, 28, 30–32, 34, 35, 40, 75, 76, 81–84, 134, 170, 172, 189; 427/8–10, 596, 166, 78, 96, 508, 593; 118/663–665, 670, 677, 679, 696, 697, 708, 712, 715; 204/192.13, 298.03; 356/301, 303, 381, 382, 237.1; 117/85; 438/7, 8; 324/716, 229; 250/559.27, 559.26, 559.19, 559.2, 559.22, 559.24

[56] References Cited

U.S. PATENT DOCUMENTS

| | | | |
|---|---|---|---|
| 4,024,291 | 5/1977 | Wilmanns | 427/10 |
| 4,311,725 | 1/1982 | Holland | 427/10 |
| 4,837,044 | 6/1989 | Muraka et al. | 427/10 |
| 5,009,485 | 4/1991 | Hall | 350/163 |
| 5,017,007 | 5/1991 | Milne et al. | 356/301 |
| 5,112,642 | 5/1992 | Wajid | 427/10 |
| 5,116,121 | 5/1992 | Knoll et al. | 356/301 |
| 5,131,752 | 7/1992 | Yu et al. | 356/369 |
| 5,208,648 | 5/1993 | Batchelder et al. | 356/237 |
| 5,354,575 | 10/1994 | Dagenais et al. | 427/10 |
| 5,425,964 | 6/1995 | Southwell et al. | 427/10 |
| 5,493,401 | 2/1996 | Horie et al. | 356/382 |
| 5,518,759 | 5/1996 | Sevillano et al. | 427/10 |
| 5,525,156 | 6/1996 | Manada et al. | 118/715 |
| 5,535,128 | 7/1996 | Laube et al. | 364/468.26 |
| 5,552,327 | 9/1996 | Bachmann et al. | 437/8 |
| 5,665,214 | 9/1997 | Iturralde | 204/298.03 |
| 5,786,893 | 7/1998 | Fink et al. | 356/301 |
| 5,835,221 | 11/1998 | Lee et al. | 356/381 |

FOREIGN PATENT DOCUMENTS

| | | |
|---|---|---|
| 59-139929 | 11/1984 | Japan . |
| 0373580 | 3/1991 | Japan ............... H01L 39/00 |
| 5102267 | 4/1993 | Japan ............... H01L 21/66 |

*Primary Examiner*—Hal Wachsman
*Attorney, Agent, or Firm*—Baker & Botts, L.L.P.

[57] ABSTRACT

A method of controlling a pulsed laser deposition process. A spectroscope is used to acquire Raman response data from a substrate as it is being coated with a film. A processor compares the response data to reference data, which may represent an uncoated substrate or an ideal film. In the former case, the attenuation of the response signal is used to indicate film thickness. In the former case, the peak characteristics of the film can be used to indicate its chemical properties. The processor may be further programmed to compare deposition rates, reaction rates, and transport rates to model data. The processor makes decisions regarding equipment control based on these comparisons. It may access heuristic rules to aid in decision making where several factors are involved.

29 Claims, 5 Drawing Sheets

PROCESS CONTROL FOR PULSED LASER DEPOSITION USING RAMAN SPECTROSCOPY

TECHNICAL FIELD OF THE INVENTION

The present invention relates generally to control systems for manufacturing processes, and more particularly to a control system that uses Raman spectroscopy data to determine deposited film characteristics during pulsed laser deposition.

BACKGROUND OF THE INVENTION

Pulsed laser deposition is a method of applying a film to the surface of a substrate material. Often the film is specified to be very thin. An example of an application of pulsed laser deposition is the deposition of superconducting films on various substrates. The desired thickness of these films is in the range of approximately 100 to 50,000 angstroms.

During the pulsed laser deposition process, the substrate is placed in a vacuum chamber together with a solid mass of target material. This target material is often a composition of materials, which will undergo a chemical reaction during the deposition process, thereby forming the desired deposit material. A high power laser has its beam incident on the target material. The laser vaporizes the target material, producing a plume. The plume diffuses toward the substrate and is deposited on the surface of the substrate.

A problem with pulsed laser deposition is that it is difficult to reliably and consistently achieve a desired morphology, physico-chemical structure, and thickness of the deposited film. Other important properties that vary because of inadequate process control are current-carrying capability, surface roughness, and response to radiation. The lack of process control is exacerbated as the size of the surface to be coated increases.

As an example of poor process control, in the case of a superconducting film of yttrium barium copper oxide, manufacturing inadequacies account for a wide variation in critical temperature. The best films have a critical temperature of 92 K, but in actuality, most films have a lower critical temperature.

SUMMARY OF THE INVENTION

One aspect of the invention is a method of using a computer to monitor the thickness of a film being deposited, such as by a pulsed laser deposition process. Data representing the Raman response of the bare substrate is stored. A spectroscope acquires data representing the Raman response of the substrate during the deposition process. A processor is programmed to compare the Raman peak intensity of the substrate reference data to that of the substrate response data. The results of the comparison are used to determine the thickness of the film.

The Raman response data may also be used to determine the chemical characteristics of the film as it is being deposited. In this case, the reference data represents the Raman peaks of an "ideal" film. Peaks of the response data are compared to those of the reference data, and this comparison is used to indicate chemical characteristics.

In the case of either film thickness measurement or chemical characteristics determination, model data can also be stored. This model data represents rates of change of associated with the deposition on the film or the plume of ablated target material. The model data can be used to decide whether some equipment control action should be taken. Furthermore, a knowledge base of heuristic rules can be stored and used to aid in the decision-making process.

An advantage of the invention is that thin film manufacturing runs can be expected to have consistent reliable output. This improves the quality and reduces the cost of any device that uses thin film coatings. The method of the invention makes use of the vibrational manifold of the crystal or molecule of the substrate and deposit material. It requires neither electronic band gap engineering or the complicated apparatus required for second harmonic generation.

DETAILED DESCRIPTION OF THE INVENTION

Figure 1:
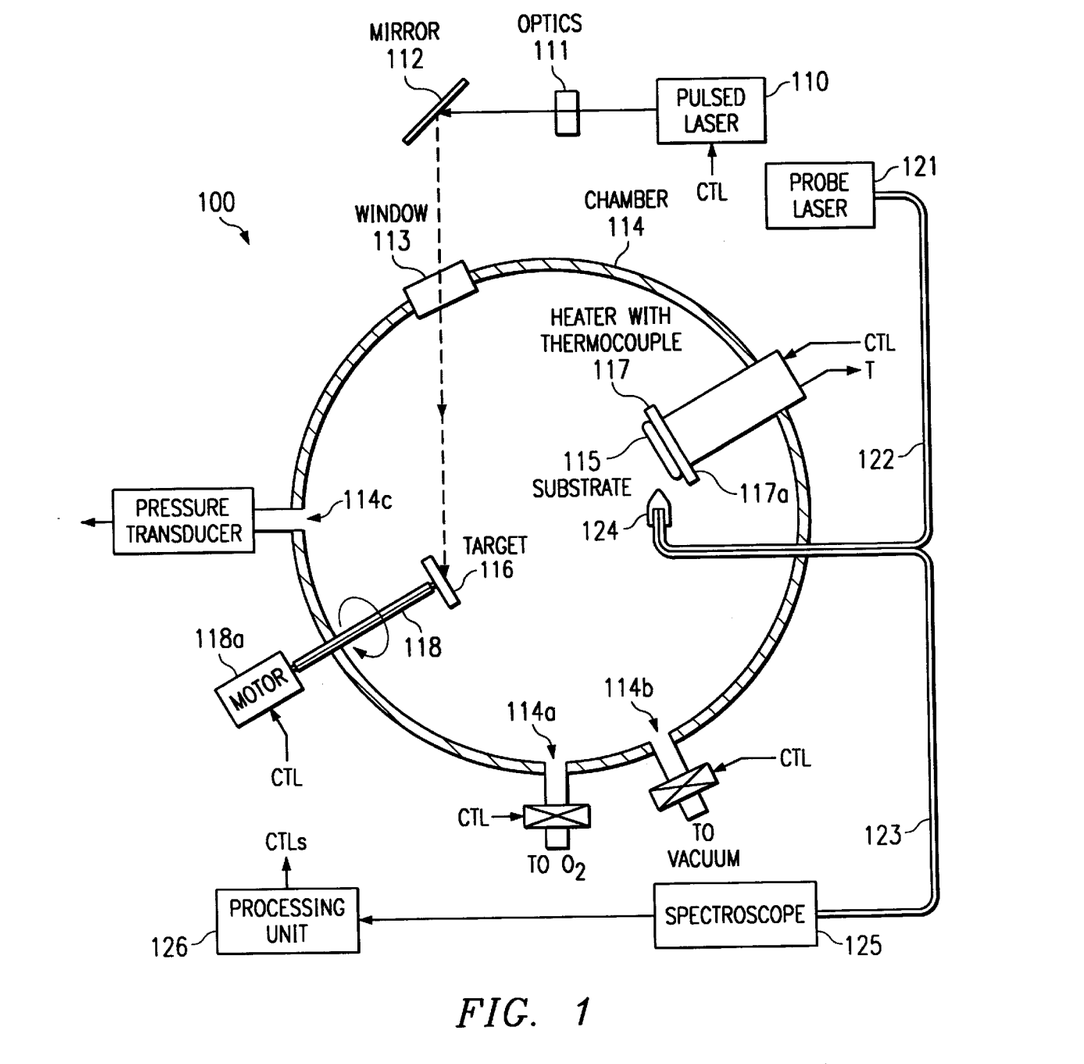
FIG. 1 illustrates a pulsed laser deposition system having a process control subsystem in accordance with the invention.

FIG. 1 illustrates a pulsed laser deposition (PLD) system 100, which is in data communication with a process control subsystem in accordance with the invention. As explained below, the process control subsystem is based on the spectroscopic response of the deposited material, specifically, Raman intensity and frequency shift data indicative of the current thickness and composition of the deposited material. The process control subsystem thereby provides a method for in-situ on-line measurements of film thickness as well as its chemical characteristics.

The process control subsystem is processor-based with a processor programmed to provide control decisions as well as thickness and composition data. The Raman response data is compared to data provided by models that represent desired characteristics of the deposited material. The comparison is used to make decisions about whether the deposition process is proceeding as desired and whether various PLD equipment controls should be adjusted. In sum, the process control subsystem of the invention implements closed loop, adaptive, intelligent process control.

PLD system 100, without the features of the present invention, is a conventional PLD system, such as those described in the Background. In operation, a pulsed laser 110 emits a beam of radiation of a desired wavelength. The laser beam passes through optics 111 that condition the beam. A mirror 112 directs the beam through a window 113 of a vacuum chamber 114.

Inside chamber 114 are a substrate 115 and a target 116. The substrate material 115 may be any material suitable for coating by PLD. Typically, substrate 115 is heated by means of a heating device 117 during the deposition process. A thermocouple 117a measures the temperature of the substrate 115, and provides a signal representing the current temperature, T. A control input (CTL) may be used to adjust the temperature.

The laser beam is directed to the target 116, which is mass of material that is typically disk shaped. The target 116 is placed on a rotating spindle 117, driven by a motor 118. As the target 116 rotates, the beam hits different points on its surface. The target 116 is ablated by the beam, forming a plume that contains atomistic clusters of material to be deposited. Mirror 112 can be used to steer the laser beam to different radial points on the surface of target 116 so that consumption of the target material is maximized.

The vacuum chamber 114 has an oxygen valve 114a, which delivers oxygen to chamber 114. A pressure valve 114b maintains the desired pressure in chamber 114, typically a vacuum. A pressure transducer 114c measures the current pressure and provides a signal representing the current pressure, P. A control input (CTL) may be used to adjust the pressure.

Although the present invention is described for use with a PLD process, the same concepts could be applied to any similar deposition process. For example, the target material could be ablated by means of an electron beam rather than a laser.

The process control subsystem, which is the subject of the present invention, comprises a probe laser 121, input optical fiber 122, output optical fiber 123, optical fiber end cover 124, spectroscope 125, and processing unit 126. During the PLD process, light from probe laser 121 is transmitted into the interior of chamber 114 via an input fiber optic probe 122. The light from the probe laser 121 is focussed to a point on the surface of substrate 115 through the plume created by ablation of the target 116. The focussing provides a stronger output Raman signal as compared to that available with a diffused incident light. The end cover 124 may be designed with appropriate micro-optics to provide the desired focussing.

Light scattered from the substrate 115 is detected by a receiving optical fiber 123. This scattered light is transmitted to a spectroscope 125. Spectroscope 125 acquires a Raman signal that represents light scattered from the substrate 115 and the material currently deposited on substrate 115. The range of data provided by spectroscope 125 covers the Raman vibrational spectrum of both substrate 115 and the deposited material. As explained below, the Raman signal is characterized by frequency shifts and peak intensities that indicate the thickness and composition of the deposited material.

In addition to providing any desired optical effect, end cover 124 is designed to protect the end surfaces of the optical fibers 122 and 123. End cover 124 is resistant to deposition and ideally, is disposable.

Further details about the use of optical fibers to perform remote Raman spectroscopy, but without the process control features of the present invention, are set out in U.S. Pat. No. 5,262,644, to John F. Maguire, entitled "Remote Spectroscopy for Raman and Brillouin Scattering". A near-infra red laser is used to irradiate a sample of material to be analyzed. Optical fibers are used to carry the incident radiation to the sample, as well as to transmit scattered radiation back to appropriate equipment for performing Raman and Brillouin analysis. The described method avoids fluorescence while at the same time providing a signal having a strength and quality that are sufficient so as to permit accurate analysis. This patent is assigned to Southwest Research Institute and incorporated by reference herein.

Figure 2:
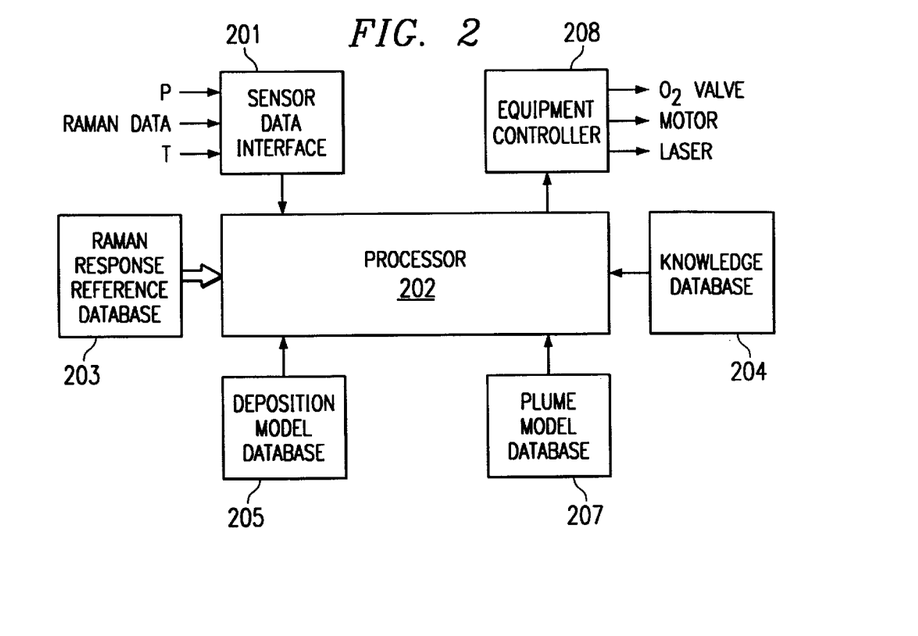
FIG. 2 is a block diagram of the processing unit of FIG. 1.

FIG. 2 is a block diagram of the processing unit 126 of FIG. 1. It receives the Raman signal acquired by spectroscope 125. As explained below, processing unit 126 is a processor-based expert system, capable of providing a wide range of control decisions.

A sensor data interface 201 accepts the Raman signal as digital values. It may also receive and digitize signals representing temperature, T, and pressure, P.

A processor 202 accesses the data from sensor data interface 201 as well as data from a reference database 203 and from model databases 205 and 207. As explained below, the reference database 203 stores Raman response data from the bare substrate 115 as well as Raman response data from a "ideal" film. The model databases store model data, which represents kinetic aspects of the PLD process and provides a basis for decision-making functions of processor 202.

Figure 3:
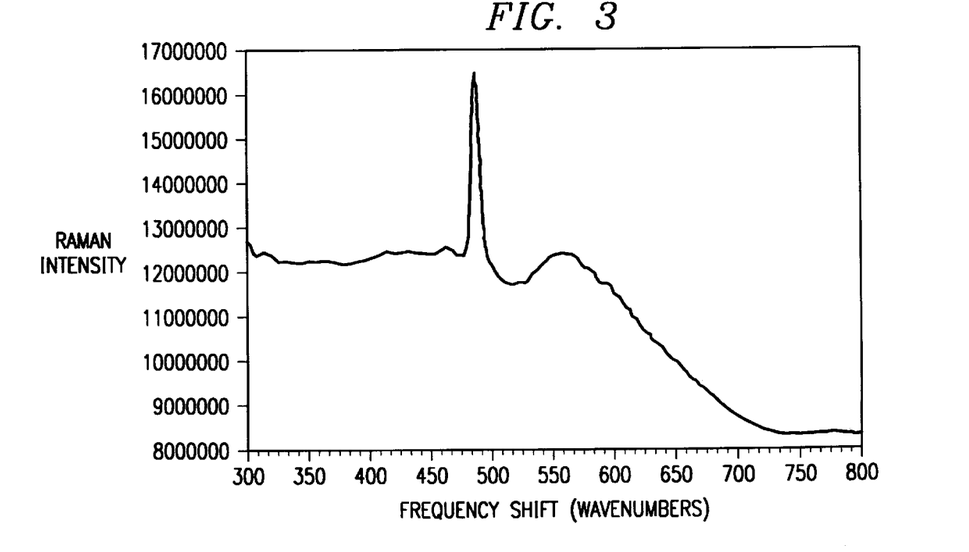
FIG. 3 illustrates substrate reference data, specifically, the Raman peak of a bare substrate, to be used in measuring thickness of a deposited film.

FIG. 3 illustrates one type of reference data that may be stored in reference database 203. The reference data of FIG. 3 is referred to herein as "substrate reference data" and represents the Raman spectrum of a substrate 115 that is uncoated or has a known film thickness. In the example of this description, the substrate 115 is bare $LaALO_3$ (lanthanum aluminum oxide) with a strong Raman peak at 485 $cm^{-1}$.

Figure 4:
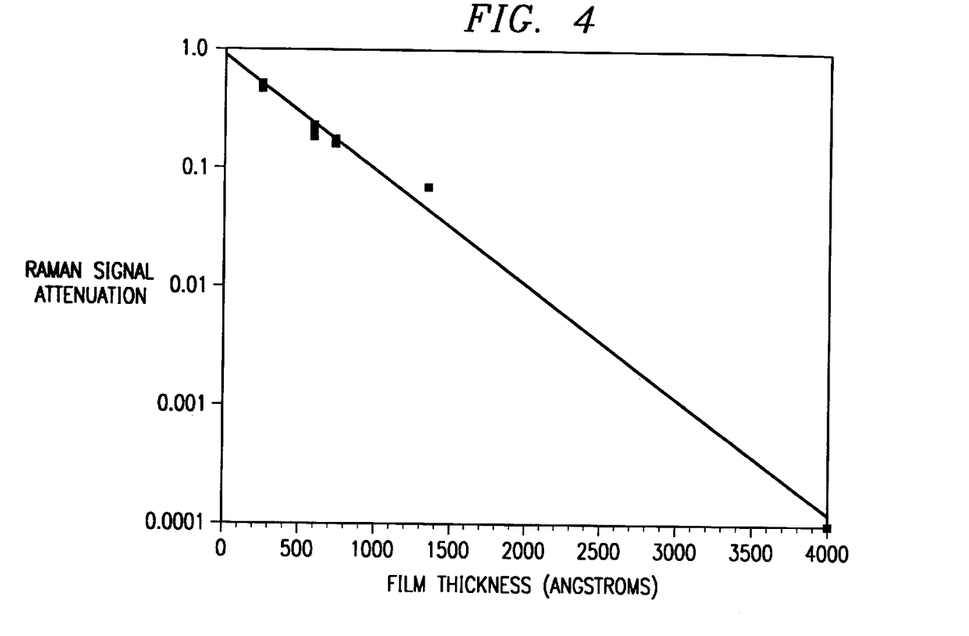
FIG. 4 illustrates the relationship between film thickness and attenuation of the Raman peak of FIG. 1.

FIG. 4 illustrates how processor 202 may be programmed to determine film thickness during the deposition process. In the example of FIG. 4, the deposited film is YBCO (yttrium barium copper oxide). During deposition, the Raman peak associated with the substrate 115 attenuates as a function of increasing film thickness. The signal attenuation is expressed logarithmically, and the attenuation is exponential. For a given signal attenuation, the film thickness is known. Even for film thicknesses in the range of 0–1000 angstroms, the attenuation is a full power of 10, making the thickness measurement sensitive to even these very thin depositions. Thus, processor 202 may be programmed to compare data acquired from spectroscope 125 to reference data to determine the current thickness of the film.

Figure 5:
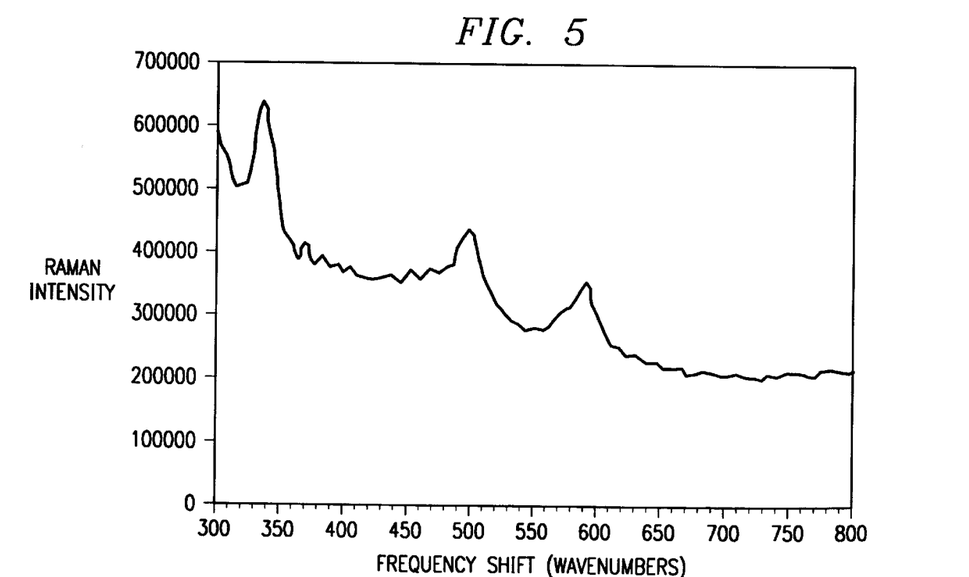
FIG. 5 illustrates film reference data, specifically, the Raman peaks of an ideal film, to be used in determining chemical characteristics of a deposited film.
Figure 6:
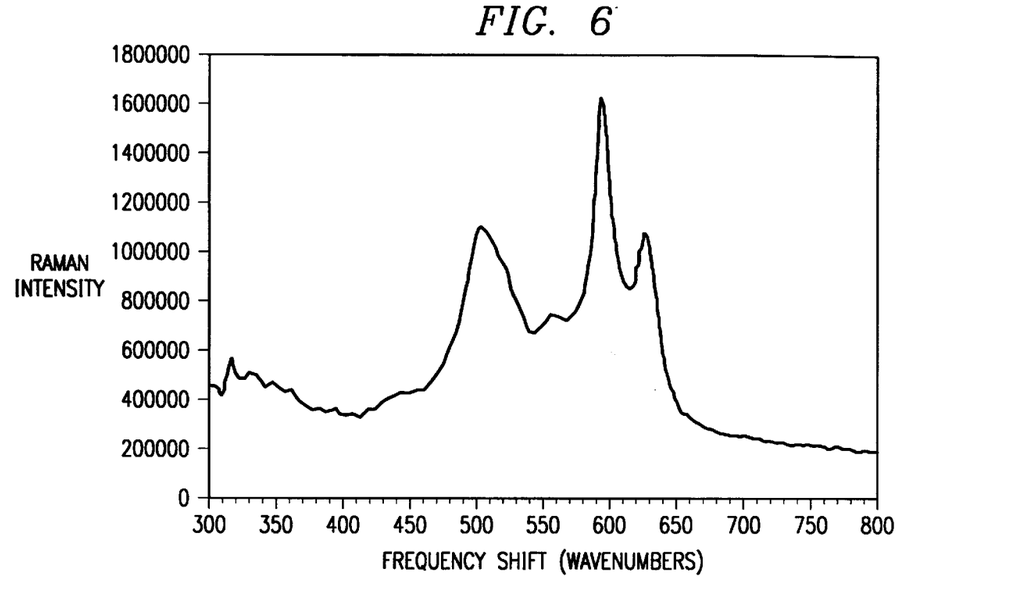
FIG. 6 illustrates film response data.
Figure 7:
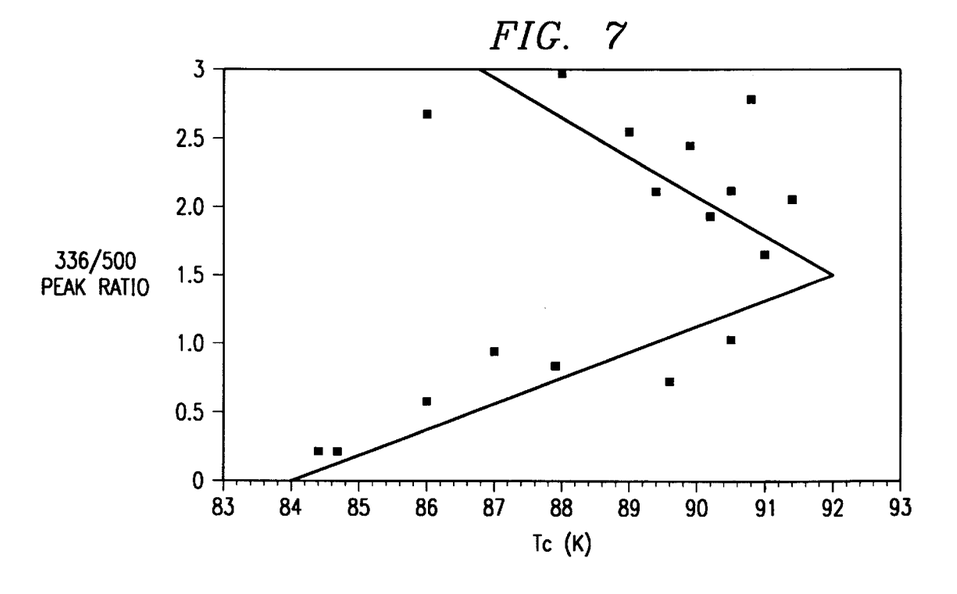
FIG. 7 illustrates Raman peak ratios versus critical temperature values for a particular film.
Figure 8:
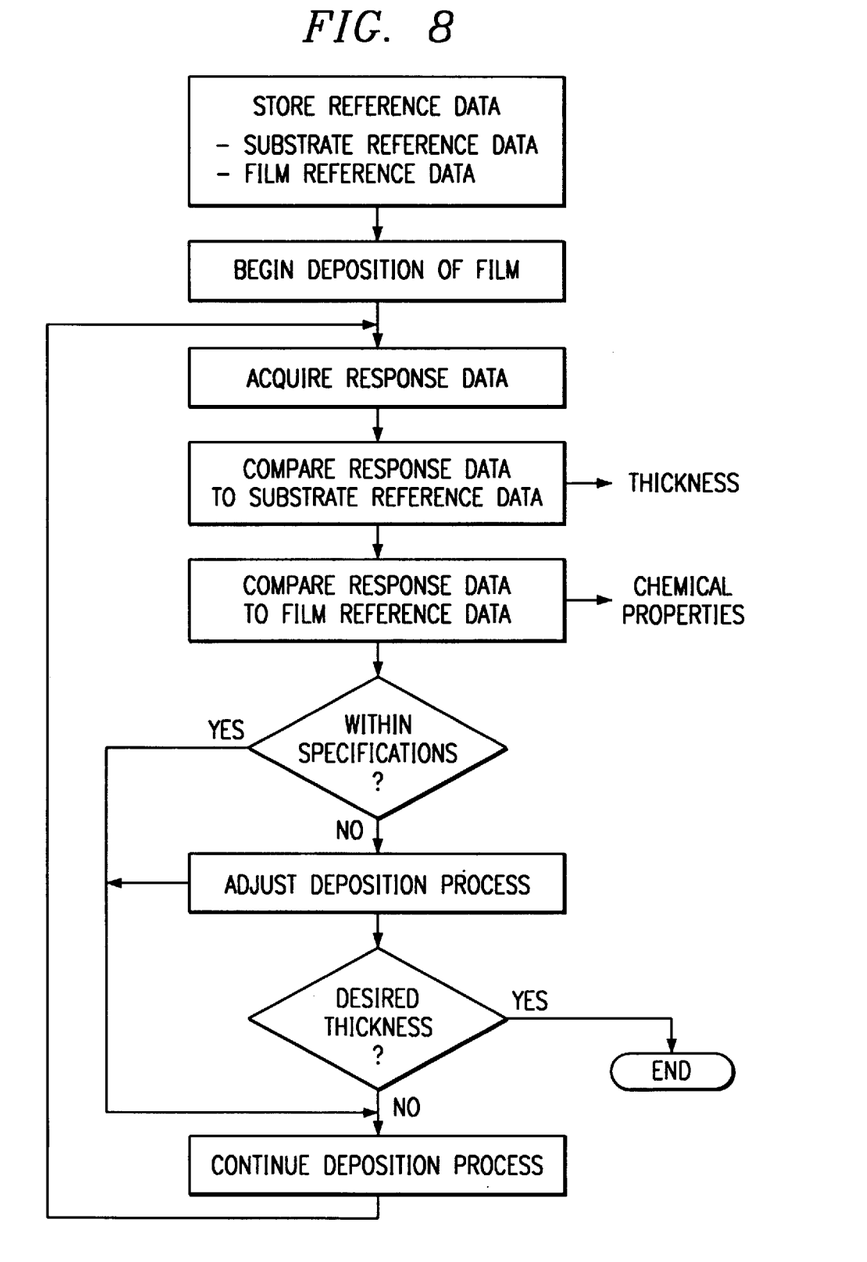
FIG. 8 illustrates a method of using Raman scattering analysis to measure the thickness and chemical properties of a deposited material.

FIGS. 5–7 illustrate how processor 202 may be programmed to determine the chemical composition of the film as it is being deposited. Again, the substrate 115 is $LaALO_3$. Target 116 is a composite material that is intended to produce YBCO. As material is deposited to provide a film of increasing thickness, the spectrum of the substrate 115 is obscured and the Raman spectrum of the film develops. In the example of FIGS. 5–7, the Raman spectrum is used to indicate the film's critical temperature, $T_C$, which is a function of chemical properties of the film.

FIG. 5 illustrates the Raman signal from an "ideal" film having a desired critical temperature, whereas FIG. 6 illustrates a deposited film having an unacceptable critical temperature. The peaks at 336 $cm^{-1}$, 486 $cm^{-1}$, and 500 $cm^{-1}$ are due to the desired phase of YBCO, whereas the peaks at 600 $cm^{-1}$ and 640 $cm^{-1}$ are tentatively assigned to a 211 phase ($Y_2BaCuO_5$) and barium cuprate ($BaCuO_2$). These are non-superconducting phases or materials that can form during the PLD process. It has been experimentally determined that superconducting films with no peak at 600 $cm^{-1}$ do not perform as well as superconducting films with a modest peak at 600 $cm^{-1}$. It also appears that a process that produces a small quantity of the 211 phase provides better superconducting films.

FIG. 7 illustrates the Raman peak ratios versus the critical temperature values for the $LaALO_3$ substrate 115 and YBCO deposition. The 336/500 peak ratio is correlated with the critical temperature. A ratio of 1:5 indicates the highest critical temperature, $T_C$.

As indicated by FIGS. 5–7, processor 202 may be programmed to compare reference data representing films having known characteristics to response data representing the film as it is being deposited. These comparisons can be used to determine the chemical composition of the film and to thereby indicate properties of the film.

In general, a characteristic of a Raman signal scattered by a particular material is that the Raman peaks are proportional to the concentration of that material. If the concentration is related to a particular property (such as critical temperature) reference data can be obtained and stored to represent what concentration is desired to obtain that property in the deposited film. The Raman response from the deposited film can be compared to the reference data to determine whether that concentration is present.

As stated above, processor 202 may also access model data. In the example of this description, there are two main types of models for any given substrate/film combination—a deposition model and a plume model, which are stored in databases 205 and 207, respectively.

The deposition model database 205 stores a model that represents a reference rate of increase in thickness of the deposited film. A plume models database 207 represents reference rates of change of the "plume", which is the region in which the material is diffused within chamber 114. The plume models represent both the transport and the reaction characteristics of the ablated target material. These models are based on the recognition that the target 116 responds to the laser ablation in two ways—it undergoes a chemical reaction as well as a physical diffusion. The reaction model includes kinetic representations of the chemical transformations. The transport model includes representations of diffusion rates.

The model data permits processor 202 to be programmed to determine whether rates of change of the deposited film satisfy modeled rates of change. Typically, the model data represents conditions that are desired, but could also represent conditions to be avoided. In either case, for purposes of this description, the model data is referred to herein as "reference" model data.

The models may be expressed in terms of changes in concentration as a function of time, that is, a rate of change in concentration. This permits the model data to be directly compared to data from spectroscope 125.

Using the model data, processor 202 may be programmed to make decisions based on both the Raman response data and the model data. For example, the Raman response might indicate that a certain desired chemical structure is not present in the deposited film. The processor 202 may then determine whether the model data indicates that a reaction is occurring too slowly or that the material is not being transported properly. Similarly, the Raman response data might indicate that the film is becoming thick too quickly as compared to the model data. These are but two examples of the many conditions that can be indicated with the model data.

If processor 202 determines that the PLD process is not occurring in a satisfactory manner, it is further programmed to take some action. It may simply display a message indicated the state of the process, or it may activate one or more automated equipment controls. In the latter case, the processor 202 determines which equipment control parameter can be adjusted to vary the rate of reaction or diffusion.

Referring again to both FIGS. 1 and 2, the various equipment control parameters typically include the energy emitted by laser 110, the spinning rate of motor 118, the amount of oxygen released by valve 114a. A controller 208 provides appropriate control signals to these various equipment controls.

As a specific example of decision-making by processor 202, referring again to FIGS. 4 and 5, the peaks in the Raman spectrum are vibrational frequencies associated with metal-oxygen bonds. Raman intensities are related to the amount of oxygen in the deposited film, which can be controlled via oxygen input valve 114a.

Knowledge base 204 may include heuristic rules for making determinations about whether the PLD process is occurring satisfactorily. For example, comparison of response and model data might indicate that the deposit is thinner than expected at a given time, but that its structure and rate of growth are satisfactory. These conditions might warrant a different action than would conditions where the deposit is not thick enough accompanied by an unacceptable rate of growth or structure.

As stated above, equipment data such as pressure and temperature are also available as inputs to processing unit 126. Processor 202 could be further programmed to compare current pressure and temperature values to desired conditions, to use them in the heuristic determinations, and to take some action. The actions may include adjustment of equipment control or simply checking equipment conditions such as pressure or temperature so that further analysis can be made.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of using a computer to measure the thickness of any non-metallic film coated upon a substrate, comprising the steps of:

storing substrate reference data derived from a waveform representing the Raman response of said substrate;

acquiring substrate response data representing the Raman response of said substrate, said substrate having said film with unknown thickness;

comparing the frequency shift peak intensity of said substrate reference data and said substrate response data;

determining the attenuation of the waveform represented by said substrate reference data; and estimating the thickness of said film, using the results of said comparing and determining steps.

2. The method of claim 1, wherein said method is performed during a deposition process during which said film is deposited upon said substrate.

3. The method of claim 2, further comprising the steps of storing deposition model data representing a reference rate of thickness change and of determining whether said deposition process is satisfactory on the basis of said deposition model data.

4. A. The method of claim 2, further comprising the step of determining an equipment control action an the basis of the estimating step.

5. The method of claim 4, wherein said deposition process is a laser deposition process, performed by a laser and wherein said equipment control action is with respect to said laser.

6. The method of claim 4, further comprising the step of receiving equipment data representing conditions of said deposition process and wherein said equipment control action is further based on said equipment data.

7. The method of claim 4, further comprising the step of accessing heuristic rules stored in a database and wherein said equipment control action is further based on said rules.

8. The method of claim 1, wherein said acquiring step is performed by irradiating said film via optical fiber and acquiring the Raman response.

9. The method of claim 1, wherein said acquiring step is performed by irradiating said film and acquiring the Raman response via optical fiber.

10. The method of claim 1, wherein said acquiring step is performed by irradiating said film with near infra red light and acquiring the Raman response.

11. A method of using a computer to monitor a deposition process of any non-metallic film being deposited upon a substrate having a Raman response, comprising the steps of:

storing film reference data representing the Raman response of a film having known chemical characteristics;

acquiring film response data representing the Raman response of said film during said deposition process;

filtering the results of said acquiring step from the Raman response of said substrate;

comparing the peak characteristics of said film reference data and said film response data; and controlling the deposition process on the basis of said comparing step.

12. The method of claim 11, further comprising the steps of storing model data representing a reference rate of change of said deposition process and of determining whether said deposition process is occurring at a satisfactory rate.

13. The method of claim 12, wherein said model data models transport characteristics of the material used to form said film.

14. The method of claim 12, wherein said model data models chemical reaction characteristics of the material used to form said film.

15. The method of claim 11, further comprising the step of determining an equipment control action to be taken if said deposition process is not satisfactory.

16. The method of claim 15, wherein said deposition process is a laser deposition process, performed by a laser and wherein said equipment control action is with respect to said laser.

17. The method of claim 15, further comprising the step of receiving equipment data representing conditions of said deposition process and wherein said equipment control action is further based on said equipment data.

18. The method of claim 15, further comprising the step of accessing heuristic rules stored in a database and wherein said equipment control action is further based on said rules.

19. The method of claim 11, wherein said film is a superconducting film.

20. The method of claim 11, further comprising the step of filtering the Raman response data of material formed during said deposition process.

21. The method of claim 11, wherein said acquiring step is performed by irradiating said film via optical fiber and acquiring the Raman response.

22. The method of claim 11, wherein said acquiring step is performed by irradiating said film and acquiring the Raman response via optical fiber.

23. The method of claim 11, wherein said acquiring step is performed by irradiating said film with near infra red light and acquiring a Raman response.

24. The method of claim 11, further comprising the step of identifying at least one chemical characteristic of said film on the basis of said comparing step.

25. A processing unit for measuring the thickness of any non-metallic film coated upon a target substrate, comprising:

a reference database that stores substrate reference data derived from a waveform representing the Raman response of a reference substrate;

a sensor data interface for receiving Raman response data scattered from the target substrate and the film;

a processor that receives the Raman response data, said processor being programmed to compare the frequency shift peak intensity of said substrate reference data and the target substrate response data, to determine the attenuation of the waveform represented by said substrate reference data, and to estimate the thickness of said film based on said attenuation.

26. A processing unit for monitoring a deposition process of any non-metallic film being deposited upon a target substrate, comprising:

a reference database that stores film reference data representing the Raman response of a reference film having known chemical characteristics;

a sensor data interface for receiving Raman response data scattered from the target substrate and the film; and a processor that receives Raman response data scattered from said substrate and said film, said processor being programmed to filter out the Raman response of the target substrate, to compare the peak characteristics of said film reference data and said film response data, and to control said deposition process on the basis of the comparison.

27. A processing unit for monitoring laser deposition equipment that deposits material during a deposition process to form a thin film on a target substrate, comprising:

a reference database that stores Raman reference data representing a reference substrate and a reference film;

a deposition model database that stores data representing reference deposition rates of the film;

a plume model database that stores data representing chemical reaction and transport characteristics of the material being deposited; and a processor that receives Raman response data scattered from the target substrate as the target substrate is being coated during the deposition process, the processor being programmed to compare the Raman response data to the Raman reference data, to the deposition model data, and to the plume model data.

28. The processing unit of claim 27, further comprising a knowledge database that stores heuristic rules accessed by said processor and where said processor is further programmed to use said heuristic rules to provide control decisions.

29. The processing unit of claim 27, wherein said processor is further programmed to provide equipment control signals and further comprising an equipment controller for delivering said control to said laser deposition equipment.

* * * * *

UNITED STATES PATENT AND TRADEMARK OFFICE
CERTIFICATE OF CORRECTION

PATENT NO.    : 6,038,525
DATED         : March 14, 2000
INVENTOR(S)   : John Francis Maguire et al.

It is certified that error appears in the above-identified patent and that said Letters Patent is hereby corrected as shown below:

<u>Column 1,</u>
Between the Title and Field of Invention, please add the following government license rights clause:

-- The U.S. Government has a paid-up license in this invention and the right in limited circumstances to require the patent owner to license others on reasonable terms, as provided for by the terms of Contract No. TMC94-5801-0011-01 awarded by Wright Patterson Air Force Base. --

Signed and Sealed this

Thirtieth Day of July, 2002

*Attest:*

*Attesting Officer*

JAMES E. ROGAN
*Director of the United States Patent and Trademark Office*